US009932657B2

(12) United States Patent
Aoki et al.

(10) Patent No.: US 9,932,657 B2
(45) Date of Patent: Apr. 3, 2018

(54) METHOD OF MAKING A NI—BASED SINGLE CRYSTAL SUPERALLOY AND TURBINE BLADE INCORPORATING SAME

(71) Applicant: IHI Corporation, Tokyo (JP)

(72) Inventors: Yasuhiro Aoki, Tokyo (JP); Akihiro Sato, New York, NY (US)

(73) Assignee: IHI CORPORATION (JP)

( * ) Notice: Subject to any disclaimer, the term of this patent is extended or adjusted under 35 U.S.C. 154(b) by 230 days.

(21) Appl. No.: 14/858,421

(22) Filed: Sep. 18, 2015

(65) Prior Publication Data

US 2016/0010183 A1 Jan. 14, 2016

Related U.S. Application Data

(62) Division of application No. 13/375,987, filed as application No. PCT/JP2010/063486 on Aug. 9, 2010, now abandoned.

(30) Foreign Application Priority Data

Aug. 10, 2009 (JP) ................................ 2009-185757

(51) Int. Cl.
*C22C 19/05* (2006.01)
*F01D 5/28* (2006.01)
(Continued)

(52) U.S. Cl.
CPC .......... *C22C 19/057* (2013.01); *C22C 19/056* (2013.01); *C22F 1/10* (2013.01);
(Continued)

(58) Field of Classification Search
CPC ................................ C22C 19/057; C22F 1/10
See application file for complete search history.

(56) References Cited

U.S. PATENT DOCUMENTS 4,582,548 A 4/1986 Harris et al. .................. 148/404
4,643,782 A 2/1987 Harris et al. .................. 148/404
(Continued)

FOREIGN PATENT DOCUMENTS

CA 2048756 A1 3/1992
EP 1 184 473 A2 3/2002
(Continued)

OTHER PUBLICATIONS

International Search Report and Written Opinion dated Nov. 2, 2010 in corresponding PCT International Application No. PCT/JP2010/063486.

(Continued)

*Primary Examiner* — Jessee Roe
(74) *Attorney, Agent, or Firm* — Ostrolenk Faber LLP

(57) ABSTRACT

The present invention provides a Ni-based single crystal superalloy which has the following composition by weight: 0.1 wt % or more and 9.9 wt % or less of Co, 5.1 wt % or more and 10.0 wt % or less of Cr, 1.0 wt % or more and 4.0 wt % or less of Mo, 8.1 wt % or more and 11.0 wt % or less of W, 4.0 wt % or more and 9.0 wt % or less of Ta, 5.2 wt % or more and 7.0 wt % or less of Al, 0.1 wt % or more and 2.0 wt % or less of Ti, 0.05 wt % or more and 0.3 wt % or less of Hf, 1.0 wt % or less of Nb and less than 3.0 wt % of Re with the remainder including Ni and unavoidable impurities. This Ni-based single crystal superalloy has a low Re content and also has excellent high-temperature strength, mainly creep strength.

1 Claim, 7 Drawing Sheets

(51) Int. Cl.
*C22F 1/10* (2006.01)
*C30B 11/00* (2006.01)
*C30B 29/52* (2006.01)

(52) U.S. Cl.
CPC ................ *F01D 5/28* (2013.01); *C30B 11/00* (2013.01); *C30B 29/52* (2013.01); *F05D 2220/30* (2013.01); *F05D 2230/40* (2013.01); *F05D 2300/131* (2013.01); *F05D 2300/132* (2013.01); *F05D 2300/133* (2013.01); *F05D 2300/135* (2013.01); *F05D 2300/175* (2013.01); *F05D 2300/177* (2013.01); *F05D 2300/607* (2013.01)

(56) References Cited

U.S. PATENT DOCUMENTS

| | | | | | |
|---|---|---|---|---|---|
| 4,719,080 | A | | 1/1988 | Duhl et al. | 420/443 |
| 5,100,484 | A | | 3/1992 | Wukusick et al. | |
| 5,154,884 | A | | 10/1992 | Wukusick et al. | 420/442 |
| 5,489,194 | A | | 2/1996 | Yoshinari et al. | |
| 6,054,096 | A | | 4/2000 | Duhl et al. | 420/448 |
| 6,159,314 | A | * | 12/2000 | Koizumi | C22F 1/10 148/428 |
| 8,771,440 | B2 | | 7/2014 | Sato et al. | |
| 2003/0041930 | A1 | | 3/2003 | DeLuca et al. | |
| 2004/0221925 | A1 | | 11/2004 | Tamaki et al. | |
| 2008/0112814 | A1 | | 5/2008 | Nazmy et al. | |
| 2011/0076180 | A1 | | 3/2011 | Suzuki et al. | |

FOREIGN PATENT DOCUMENTS

| | | | |
|---|---|---|---|
| EP | 1431405 | A1 | 6/2004 |
| EP | 1 876 263 | A1 | 1/2008 |
| GB | 1 592 237 | | 7/1981 |
| GB | 2 234 521 | A | 2/1991 |
| JP | 53-146223 | | 12/1978 |
| JP | 59-019032 | | 1/1984 |
| JP | 7-070679 | | 3/1995 |
| JP | 11-246924 | | 9/1999 |
| RU | 2026399 | C1 | 1/1995 |
| RU | 2297466 | C2 | 4/2007 |
| WO | WO 2006/067189 | A1 | 6/2006 |
| WO | WO 2007/037277 | | 4/2007 |
| WO | WO 2007/122931 | | 11/2007 |

OTHER PUBLICATIONS

N. Saunders et al., “Modelling the Material Properties and Behaviour of Ni—Based Superalloys,” Superalloys 2004 (TMS, 2004), pp. 849-858.

Canadian Office Action dated Nov. 22, 2012 issued in corresponding Canadian Patent Application No. 2,764,664.

Chinese Office Action and English translation dated Mar. 6, 2013 issued in corresponding Chinese Patent Application No. 201080028753.3.

Russian Federation Notice of Allowance, dated Jan. 23, 2014, issued in corresponding Russian Patent Application No. 2011153366/02(080297). English translation. Total 11 pages.

Extended European Search Report and European Search Opinion dated Feb. 4, 2015 in corresponding European Patent Application No. 10808201.7 (10 pages).

* cited by examiner

FIG. 4

| | Alloy | Alloy composition(wt%) | | | | | | | | | | | | VALUE CALCULATED BY JMatPro |
|---|---|---|---|---|---|---|---|---|---|---|---|---|---|---|
| | | Co | Cr | Mo | W | Al | Ti | Nb | Ta | Hf | Re | Ru | Ni | |
| CONVENTIONAL NI-BASED SINGLE CRYSTAL SUPERALLOY | PWA1480 | 5.1 | 9.4 | 0.0 | 3.9 | 5.0 | 1.4 | 0.0 | 12.6 | 0.1 | 0.0 | 0.0 | 62.4 | 50 |
| | ReneN4 | 7.4 | 9.1 | 1.5 | 6.0 | 4.2 | 3.5 | 0.5 | 4.8 | 0.2 | 0.0 | 0.0 | 62.8 | 82 |
| | CMSX-2 | 4.6 | 8.0 | 0.6 | 7.9 | 5.6 | 0.9 | 0.0 | 5.8 | 0.0 | 0.0 | 0.0 | 66.6 | 95 |
| | PWA1484 | 10.0 | 5.0 | 2.0 | 6.0 | 5.6 | 0.0 | 0.0 | 9.0 | 0.1 | 3.0 | 0.0 | 59.3 | 149 |
| | ReneN5 | 8.0 | 7.0 | 2.0 | 5.0 | 6.2 | 0.0 | 0.0 | 7.0 | 0.2 | 3.0 | 0.0 | 61.6 | 131 |
| | CMSX4 | 9.6 | 6.4 | 0.6 | 6.4 | 5.6 | 1.0 | 0.0 | 6.5 | 0.1 | 3.0 | 0.0 | 60.8 | 147 |
| NI-BASED SINGLE CRYSTAL SUPERALLOY OF THE PRESENT EMBODIMENT | a | 6.0 | 7.0 | 1.5 | 10.0 | 6.0 | 0.0 | 0.0 | 5.5 | 0.1 | 0.0 | 0.0 | 63.9 | 149 |
| | b | 8.0 | 7.0 | 1.8 | 8.2 | 5.2 | 1.6 | 0.0 | 6.0 | 0.1 | 0.8 | 0.0 | 61.3 | 139 |
| | c | 8.0 | 6.5 | 1.4 | 8.0 | 5.5 | 1.0 | 0.0 | 6.0 | 0.1 | 1.4 | 0.0 | 62.1 | 169 |
| | d | 0.1 | 7.0 | 1.8 | 9.0 | 5.7 | 1.6 | 0.0 | 6.0 | 0.1 | 0.8 | 0.0 | 67.9 | 137 |
| | e | 9.9 | 7.0 | 1.8 | 8.2 | 5.2 | 1.6 | 0.0 | 6.0 | 0.1 | 0.8 | 0.0 | 59.4 | 152 |
| | f | 8.0 | 5.1 | 1.8 | 8.2 | 5.2 | 1.6 | 0.0 | 6.0 | 0.1 | 0.8 | 0.0 | 63.2 | 145 |
| | g | 8.0 | 10.0 | 1.8 | 8.2 | 5.5 | 1.6 | 0.0 | 6.0 | 0.1 | 0.8 | 0.0 | 58.0 | 135 |
| | h | 8.0 | 7.0 | 1.0 | 8.2 | 5.2 | 1.6 | 0.0 | 6.0 | 0.1 | 0.8 | 0.0 | 62.1 | 132 |
| | i | 8.0 | 7.0 | 4.0 | 8.1 | 5.2 | 1.6 | 0.0 | 6.0 | 0.1 | 0.8 | 0.0 | 59.2 | 155 |
| | j | 8.0 | 7.0 | 1.8 | 11.0 | 5.2 | 1.6 | 0.0 | 6.0 | 0.1 | 0.8 | 0.0 | 58.5 | 137 |
| | k | 8.0 | 7.0 | 1.8 | 8.2 | 7.0 | 0.1 | 0.0 | 6.0 | 0.1 | 0.8 | 0.0 | 61.0 | 199 |
| | l | 8.0 | 7.0 | 1.8 | 8.2 | 6.0 | 0.1 | 0.0 | 6.0 | 0.1 | 0.8 | 0.0 | 62.0 | 139 |
| | m | 8.0 | 7.0 | 1.8 | 8.2 | 5.2 | 2.0 | 0.0 | 6.0 | 0.1 | 0.8 | 0.0 | 60.9 | 155 |
| | n | 8.0 | 7.0 | 1.8 | 8.2 | 6.0 | 1.6 | 0.0 | 4.0 | 0.1 | 0.8 | 0.0 | 62.5 | 188 |
| | o | 8.0 | 7.0 | 1.8 | 8.2 | 5.2 | 1.6 | 0.0 | 9.0 | 0.1 | 0.8 | 0.0 | 58.3 | 149 |
| | p | 8.0 | 6.5 | 1.4 | 8.0 | 5.5 | 1.0 | 0.0 | 6.0 | 0.3 | 1.4 | 0.0 | 61.9 | 142 |
| | q | 8.0 | 6.5 | 1.4 | 8.0 | 5.5 | 1.0 | 0.0 | 6.0 | 0.1 | 0.0 | 0.0 | 63.5 | 127 |
| | r | 8.0 | 7.0 | 1.8 | 8.2 | 5.2 | 1.6 | 0.0 | 6.0 | 0.1 | 3.0 | 0.0 | 59.1 | 179 |

METHOD OF MAKING A NI—BASED SINGLE CRYSTAL SUPERALLOY AND TURBINE BLADE INCORPORATING SAME

CROSS-REFERENCE TO RELATED APPLICATIONS

The present patent application is a divisional of prior U.S. patent application Ser. No. 13/375,987, now abandoned, filed Dec. 2, 2011, by Yasuhiro Aoki and Akihiro Sato, entitled "Ni-BASED SINGLE CRYSTAL SUPERALLOY AND TURBINE BLADE," which is a 35 U.S.C. §§ 371 national phase conversion of International Application No. PCT/JP2010/063486, filed Aug. 9, 2010, which claims priority of Japanese Patent Application No. 2009-185757, filed Aug. 10, 2009. The PCT International Application was published in the Japanese language. The contents of each of the patent applications listed above are incorporated in full herein by reference.

TECHNICAL FIELD

The present invention relates to a Ni-based single crystal superalloy and a turbine blade.

BACKGROUND ART

Turbine blades (stator blades and rotor blades) used in aircraft engines, industrial gas turbines and other systems are often operated in high-temperature environments for a prolonged time and thus are made of a Ni-based single crystal superalloy that has an excellent heat resistance. The Ni-based single crystal superalloy is produced in the following manner. Al is first added to base Ni to cause $Ni_3Al$ to precipitate for precipitation strengthening. High melting point metals, such as Cr, W and Ta, are then added to form an alloy which is formed as a single crystal.

There is known, as such a Ni-based single crystal superalloy, for example, a second generation alloy or the like (for example, CMSX-4 manufactured by Cannon-Muskegon Corporation, PWA1484 manufactured by United Technologies Corporation) in which high-temperature strength, mainly creep strength (also including high-temperature fatigue strength) is enhanced by inclusion of a first generation alloy containing no Re (for example, CMSX-2 manufactured by Cannon-Muskegon Corporation, PWA1480 manufactured by United Technologies Corporation) and 3 wt % of Re. CMSX and PWA are trademarks of alloys.

[Patent Document 1]

U.S. Pat. No. 4,582,548

[Patent Document 2]

U.S. Pat. No. 4,643,782

[Patent Document 3]

Japanese Unexamined Patent Application, First Publication No. Sho 53-146223

DISCLOSURE OF INVENTION

Problem that the Invention is to Solve

The second generation Ni-based single crystal superalloy is a Ni-based single crystal superalloy in which high-temperature strength, mainly creep strength is enhanced, as compared to the first generation Ni-based single crystal superalloy, by inclusion of Re. Namely, it is known that high-temperature strength, mainly creep strength of the Ni-based single crystal superalloy can be enhanced by inclusion of Re.

However, since Re is rare metal, it is difficult to stably ensure supply of a large amount of Re. The price of Re has recently risen and use of a large amount of Re causes a rise in prices of products.

Therefore, it is desired to develop a Ni-based single crystal superalloy having high-temperature strength, mainly creep strength, which is at least higher than that of the first generation Ni-based single crystal superalloy, and desirably high-temperature strength, mainly creep strength, which is equal to or higher than that of the second generation Ni-based single crystal superalloy, while decreasing the amount of Re as compared to the second generation Ni-based single crystal superalloy.

In light of the problems described above, the present invention has been made and an object thereof is to provide a Ni-based single crystal superalloy which has a low amount of Re and is also excellent in high-temperature strength, mainly creep strength.

Means for Solving the Problem

The present invention employs, as means for solving the problems described above, the following constitutions.

A first invention is a Ni-based single crystal superalloy which has the following composition by weight: 0.1 wt % or more and 9.9 wt % or less of Co, 5.1 wt % or more and 10.0 wt % or less of Cr, 1.0 wt % or more and 4.0 wt % or less of Mo, 8.1 wt % or more and 11.0 wt % or less of W, 4.0 wt % or more and 9.0 wt % or less of Ta, 5.2 wt % or more and 7.0 wt % or less of Al, 0.1 wt % or more and 2.0 wt % or less of Ti, 0.05 wt % or more and 0.3 wt % or less of Hf, 1.0 wt % or less of Nb and less than 3.0 wt % of Re with the remainder including Ni and unavoidable impurities.

A second invention is a Ni-based single crystal superalloy according to the above first invention, wherein the amount of Re is 2.0 wt % or less by weight.

A third invention is a Ni-based single crystal superalloy according to the above first invention, wherein the amount of Re is 1.4 wt % or less by weight.

A fourth invention is a Ni-based single crystal superalloy according to the above first invention, wherein the amount of Re is 0.8 wt % or less by weight.

A fifth invention is a Ni-based single crystal superalloy according to the any one of the above first to fourth inventions, which contains6.0 wt % of Co, 7.0 wt % of Cr, 1.5 wt % of Mo, 10.0 wt % of W, 5.5 wt % of Ta, 6.0 wt % of Al, 0.1 wt % of Ti and 0.10 wt % of Hf by weight, and contains neither Nb nor Re or contains them as unavoidable impurities.

A sixth invention is a Ni-based single crystal superalloy according to the any one of the above first to fourth inventions, which contains 8.0 wt % of Co, 7.0 wt % of Cr, 1.8 wt % of Mo, 8.2 wt % of W, 6.0 wt % of Ta, 5.2 wt % of Al, 1.6 wt % of Ti, 0.10 wt % of Hf and 0.8 wt % of Re by weight, and contains no Nb or contains it as an unavoidable impurity.

A seventh invention is a Ni-based single crystal superalloy according to the any one of the above first to third inventions, which contains 8.0 wt % of Co, 6.5 wt % of Cr, 1.4 wt % of Mo, 8.1 wt % of W, 6.0 wt % of Ta, 5.8 wt % of Al, 1.0 wt % of Ti, 0.10 wt % of Hf and 1.4 wt % of Re, and contains no Nb or contains it as an unavoidable impurity.

An eighth invention is a turbine blade which incorporates the Ni-based single crystal superalloy according to any one of the above first to seventh inventions.

Effects of the Invention

According to the present invention, the amount of Re contained in the Ni-based single crystal superalloy is less than 3.0 wt %. Therefore, the Ni-based single crystal superalloy of the present invention has a smaller amount of Re as compared to the second generation Ni-based single crystal superalloy.

Describing in more detail hereinafter, the Ni-based single crystal superalloy of the present invention has high-temperature strength, mainly creep strength which is higher than that of the first generation Ni-based single crystal superalloy.

Therefore, the Ni-based single crystal superalloy of the present invention has a smaller amount of Re as compared to the second generation Ni-based single crystal superalloy, and is also excellent in high-temperature strength, mainly creep strength as compared to the first generation Ni-based single crystal superalloy.

BRIEF DESCRIPTION OF THE DRAWINGS

FIG. 4 is a table showing the composition of a Ni-based single crystal superalloy used in a simulation.

DESCRIPTION OF THE PREFERRED EMBODIMENTS

Figure 1:
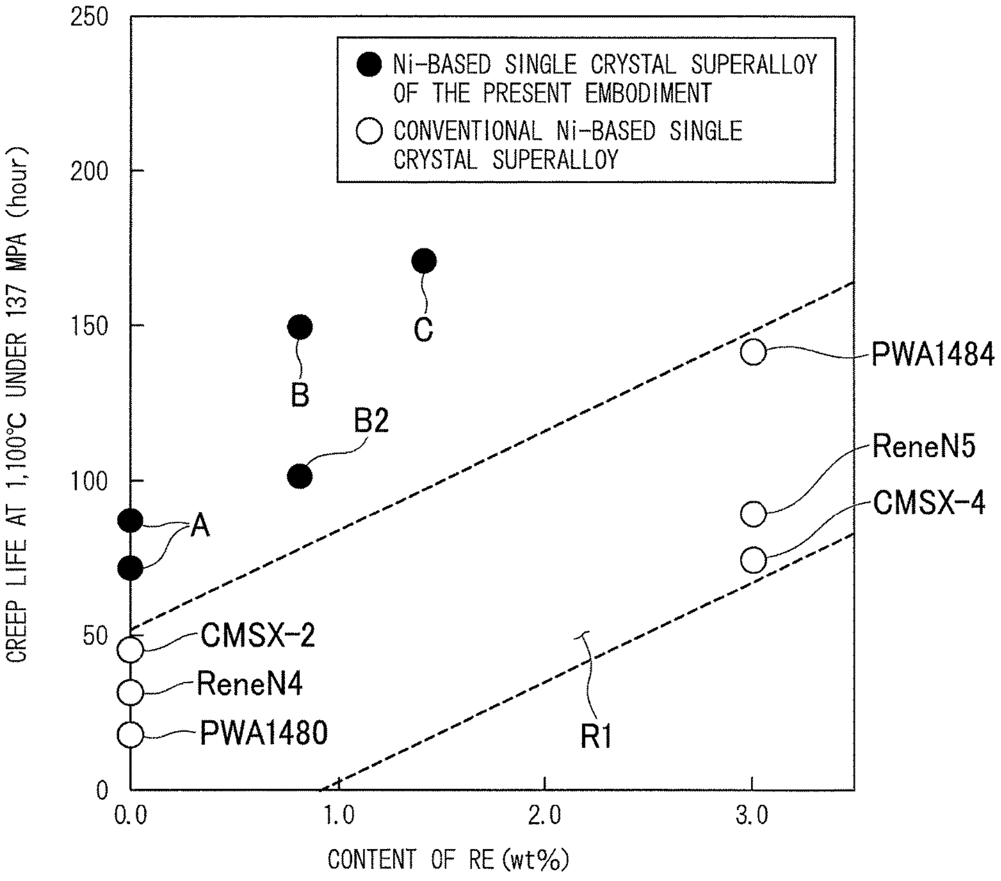
FIG. 1 is a graph obtained by a test for making a comparison in a creep life between a Ni-based single crystal superalloy according to one present embodiment of the present invention and the first and second generation Ni-based single crystal superalloys.

One embodiment of a Ni-based single crystal superalloy and a turbine blade according to the present invention will be described with reference to the accompanying drawings shown below. In the drawings shown below, the scale of each member has been appropriately altered in order to make each member a recognizable size.

The Ni-based single crystal superalloy of the present embodiment has the following composition by weight: 0.1 wt % or more and 9.9 wt % or less of Co, 5.1 wt % or more and 10.0 wt % or less of Cr, 1.0 wt % or more and 4.0 wt % or less of Mo, 8.1 wt % or more and 11.0 wt % or less of W, 4.0 wt % or more and 9.0 wt % or less of Ta, 5.2 wt % or more and 7.0 wt % or less of Al, 0.1 wt % or more and 2.0 wt % or less of Ti, 0.05 wt % or more and 0.3 wt % or less of Hf, 1.0 wt % or less of Nb and less than 3.0 wt % of Re with the remainder including Ni and unavoidable impurities.

Also, the amount of Re in the Ni-based single crystal superalloy of the present embodiment is more preferably 2.0 wt % or less, 1.4 wt % or less, or 0.8 wt % or less by weight.

"Unavoidable impurities" are impurities which are included without being intentionally introduced in the production process until a Ni-based single crystal superalloy of the present embodiment is obtained and are present in trace amounts (for example, 0.1 wt % or less), and also which do not necessarily exert an influence on characteristics of the Ni-based single crystal superalloy.

Examples of the unavoidable impurities include B, C, Si, Y, La, Ce, V, Zr, Nb, Ru, Re and the like.

The composition ranges of the components of the Ni-based single crystal superalloy are controlled based on their characteristics described below.

Co is an element that increases the solid solubility limit to the matrix containing Al, Ta and other elements in high-temperature environments and causes the fine γ' phase to disperse and precipitate in heat treatment so as to enhance the high-temperature strength. If more than 9.9 wt % of Co exists, the composition ratio with other elements, including Al, Ta, Mo, W, Hf and Cr, becomes unbalanced. As a result, a harmful phase precipitates to decrease the high-temperature strength. Due to the necessity of enhancing the high-temperature strength, 0.1 wt % or more of Co preferably exists. The amount of Co is therefore preferably 0.1 wt % or more and 9.9 wt % or less.

Cr is an element that has excellent oxidation resistance and improves, altogether with Hf and Al, high-temperature corrosion resistance of the Ni-based single crystal superalloy. If the amount of Cr is less than 5.1 wt %, it is difficult to provide a desired high-temperature corrosion resistance. If the amount of Cr exceeds 10.0 wt %, precipitation of the γ' phase is inhibited and harmful phases, such as σ phase and μ phase, may precipitate to decrease the high-temperature strength. The amount of Cr is therefore preferably 5.1 wt % or more and 10.0 wt % or less.

Mo is an element that enhances the high-temperature strength by solid-dissolving in the γphase which becomes the matrix, in the copresence of W or Ta, and also improves high-temperature strength due to precipitation hardening. If the amount of Mo is less than 1.0 wt %, it is difficult to provide desired high-temperature strength. If the amount of Mo exceeds 4.0 wt %, the high-temperature strength decreases and the high-temperature corrosion resistance deteriorates. The amount of Mo is therefore preferably 1.0 wt % or more and 4.0 wt % or less.

W is an element that enhances the high-temperature strength due to the actions of solution hardening and precipitation hardening in the copresence of Mo or Ta. In order to enhance the high-temperature strength, 8.1 wt % or more of W preferably exists. If the amount of W exceeds 11.0 wt %, the high-temperature corrosion resistance deteriorates. The amount of W is therefore preferably 8.1 wt % or more and 11.0 wt % or less.

Ta is an element that enhances the high-temperature strength due to the actions of solution hardening and precipitation hardening in the copresence of Mo or W. Ta also enhances the high-temperature strength by the precipitation hardening relative to the γ' phase. If the amount of Ta is less than 4.0 wt %, it is difficult to provide desired high-temperature strength. If the amount of Ta exceeds 9.0 wt %, a harmful phase, such as a phase and μ phase, may precipitate to decrease the high-temperature strength. The amount of Ta is therefore preferably 4.0 wt % or more and 9.0 wt % or less.

Al combines with Ni to form a 60 to 70% (volume percentage) of an intermetallic compound represented by $Ni_3Al$, which is the fine γ' phase to be uniformly dispersed and precipitated into the matrix. That is, Al is an element that enhances the high-temperature strength altogether with Ni. Furthermore, Al is excellent in oxidation resistance, and improves, altogether with Cr and Hf, the high-temperature corrosion resistance of the Ni-based single crystal superalloy. If the amount of Al is less than 5.2 wt %, the precipitation amount of the γ' phase is insufficient and it is thus difficult to provide desired high-temperature strength and high-temperature corrosion resistance. If the amount of Al exceeds 7.0 wt %, a large amount of a coarse eutectic γ phase called a eutectic γ' phase is formed, which makes it impossible to carry out a solution heat treatment and thus it becomes difficult to provide desired high-temperature strength. The amount of Al is therefore preferably 5.2 wt % or more and 7.0 wt % or less.

Ti is an element that enhances the high-temperature strength due to the actions of solution hardening and precipitation hardening in the copresence of Mo or W. Ti also enhances the high-temperature strength by the precipitation hardening with relative to the γ'-phase. If the amount of Ti exceeds 2.0 wt %, a harmful phase may precipitate to decrease the high-temperature strength. In order to enhance the high-temperature strength, 0.1 wt % or more of Ti preferably exists. The amount of Ti is therefore preferably 0.1 wt % or more and 2.0 wt % or less.

Hf is an element that segregates at the grain boundary and distributed unevenly in grain boundary to strengthen the same so as to enhance the high-temperature strength. Furthermore, Hf is excellent in oxidation resistance, and improves, altogether with Cr and Al, high-temperature corrosion resistance of the Ni-based single crystal superalloy. In order to enhance the high-temperature strength, 0.05 wt % or more of Hf preferably exists. If the amount of Hf exceeds 0.3 wt %, local melting occurs to decrease the high-temperature strength. The amount of Hf is therefore preferably 0.05 wt % or more and 0.3 wt % or less.

Nb is an element that enhances the high-temperature strength. However, if the amount of Nb exceeds 1.0 wt %, a harmful phase precipitates to decrease the high-temperature strength. The amount of Nb is therefore preferably 1.0 wt % or less.

Re is an element that enhances the high-temperature strength due to solid-solution strengthening by solid-dissolving in the γ phase which is the matrix. Re also enhances the corrosion resistance. However, if the amount of Re is 3.0 wt % or more, it becomes necessary to use Re in the same amount as that of a conventional second generation Ni-based single crystal superalloy. However, since it may be difficult to stably ensure supply of Re and also Re is expensive, the price of a Ni-based single crystal superalloy drastically rises when the amount of Re is large. In the present embodiment, even if the amount of Re is inhibited or Re is not included, it is possible to maintain enhanced high-temperature strength, mainly high creep strength in high-temperature environments by setting a composition ratio of other elements at an optimum range.

In the Ni-based single crystal superalloy of the present embodiment, the amount of Re is less than 3 wt %. Furthermore, in the Ni-based single crystal superalloy of the present embodiment, the amount of Re is preferably 2.0 wt % or less, more preferably 1.4 wt % or less, and still more preferably 0.8 wt % or less.

Subsequently, the results of tests carried out so as to make a comparison in a creep life between a Ni-based single crystal superalloy of the present embodiment and the first and second generation Ni-based single crystal superalloys with reference to FIG. 1 will be described.

FIG. 1 is a graph for making a comparison in a creep life between a Ni-based single crystal superalloy according to one present embodiment of the present invention obtained by a test and the first and second generation Ni-based single crystal superalloys. In FIG. 1, the abscissa denotes the amount of Re (wt %), while the ordinate denotes the creep life.

Black dots A to C shown in FIG. 1 denote the results in which the creep life was measured by a test under the condition of a tensile load of 137 Mpa in an environment of a temperature of 1,100° C., using Ni-based single crystal superalloys A, B, B2 and C as the Ni-based single crystal superalloy of the present embodiment. Herein, a Ni-based single crystal superalloy A contains: 6.0 wt % of Ce, 7.0 wt % of Co, 1.5 wt % of Mo, 10.0 wt % of W, 5.5 wt % of Ta, 6.0 wt % of Al, 0.1 wt % of Ti and 0.10 wt % of Hf by weight, and contains neither Nb nor Re or contain them as unavoidable impurities. A Ni-based single crystal superalloy B contains: 8.0 wt % of Co, 7.0 wt % of Cr, 1.8 wt % of Mo, 8.2 wt % of W, 6.0 wt % of Ta, 5.2 wt % of Al, 1.6 wt % of Ti, 0.10 wt % of Hf and 0.8 wt % of Re by weight, and contains no Nb or contains it as an unavoidable impurity. A Ni-based single crystal superalloy B2 contains: 8.0 wt % of Co, 7.0 wt % of Cr, 1.8 wt % of Mo, 8.2 wt % of W, 6.2 wt % of Ta, 5.4 wt % of Al, 1.2 wt % of Ti, 0.1 wt % of Hf and 0.8 wt % of Re by weight, and contains no Nb or contains it as an unavoidable impurity. A Ni-based single crystal superalloy C contains: 8.0 wt % of Co, 6.5 wt % of Cr, 1.4 wt % of Mo, 8.1 wt % of W, 6.0 wt % of Ta, 5.8 wt % of Al, 1.0 wt % of Ti, 0.10 wt % of Hf and 1.4 wt % of Re by weight, and contains no Nb or contains it as an unavoidable impurity.

The method of producing a Ni-based single crystal superalloy of the present embodiment is as follows.

First, a molten Ni-based single crystal superalloy is prepared using a vacuum melting furnace and an alloy ingot is casted using this molten alloy.

Furthermore, the alloy ingot is subjected to a solution heat treatment and an aging treatment to obtain a Ni-based single crystal superalloy. The solution heat treatment is carried out by raising the ingot from a temperature within a range of 1,503 to 1,563 K (1,230 to 1,290° C.) to a temperature within a range of 1,573 to 1,613 K (1,300 to 1340° C.) by a multi-stage step, followed by maintaining of such a temperature for 1 to 10 hours or more. The aging treatment is carried out by a primary aging treatment of maintaining the ingot at a temperature within a range of 1,273 to 1,423 K (1,000° C. to 1,150° C.) for 3 to 5 hours. Then, a secondary aging treatment of maintaining the ingot at a temperature within a range of 1,073 to 1,223 K (800° C. to 950° C.) for 15 to 25 hours is carried out.

CMSX-2, CMSX-4, ReneN4, ReneN5, PWA1480 and PWA1484 shown by white dots in FIG. 1 denote the results of a test of each Ni-based single crystal superalloy carried out under the same conditions as in the Ni-based single crystal superalloy of the present embodiment. CMSX, Rene and PWA are trademarks of alloys.

As is apparent from FIG. 1, the Ni-based single crystal superalloy A of the present embodiment clearly have longer creep life and higher creep strength as compared to CMSX-2, ReneN4 and PWA1480 which similarly do not contain Re as a useful component (first generation Ni-based single crystal superalloy).

As used herein, "do not contain Re as a useful component" includes, in addition to the case where no Re is included at all, the case where Re is included as an unavoidable impurity.

From the creep life of CMSX-2, PWA1480, ReneN4, ReneN5, CMSX-4 and PWA1484, it is assumes that, when the amount of Re in these conventional Ni-based single crystal superalloys varies within a range of 3.0 wt % or less, the life of the Ni-based single crystal superalloy is included in the region R1 shown in FIG. 1. As is apparent from FIG. 1, the Ni-based single crystal superalloys B and B2 of the present embodiment clearly have longer creep life as compared to the creep life to be assumed in the case where a conventional Ni-based single crystal superalloy contains 0.8 wt % of Re, and also has higher creep strength.

It is possible to confirm that the Ni-based single crystal superalloy C of the present embodiment clearly has longer creep life as compared to the creep life to be assumed in the case where a conventional Ni-based single crystal superalloy contains 1.4 wt % of Re, and also has higher creep strength.

As is apparent from FIG. 1, these Ni-based single crystal superalloys B, B2 and C of the present embodiment show longer creep life and higher creep strength as compared to the first generation Ni-based single crystal superalloy.

As is apparent from FIG. 1, the Ni-based single crystal superalloy A of the present embodiment has a creep life, that is, a creep strength which is comparable with that of CMSX-4 containing 3.0 wt % of Re (second generation Ni-based single crystal superalloy).

As is apparent from FIG. 1, the Ni-based single crystal superalloy B of the present embodiment has a creep life, that is, a creep strength which is comparable with that of PWA1484 containing 3.0 wt % of Re (second generation Ni-based single crystal superalloy), and also has longer creep life, that is, high creep strength as compared to CMSX-4 and ReneN5 (second generation Ni-based single crystal superalloys).

As is apparent from FIG. 1, the Ni-based single crystal superalloy C of the present embodiment has longer creep life, that is, higher creep strength as compared to CMSX-4, ReneN5 and PWA1484 containing 3.0 wt % of Re.

Regarding an actual value of the creep life in the present test, the actual values of the creep life of the Ni-based single crystal superalloys A of the present embodiment (which do not contain Re as a useful component) are 72 hours and 87 hours, the actual value of the creep life of the Ni-based single crystal superalloy B of the present embodiment (Re: 0.8 wt %) is 149 hours, the actual value of the creep life of the Ni-based single crystal superalloy B2 of the present embodiment (Re: 0.8 wt %) is 101 hours, the actual value of the creep life of the Ni-based single crystal superalloy C of the present embodiment (Re: 1.4 wt %) is 170 hours, the actual value of the creep life of PWA 1480 is 18 hours, the actual value of the creep life of ReneN4 is 31 hours, the actual value of the creep life of CMSX-2 is 45 hours, the actual value of the creep life of PWA1484 is 141 hours, the actual value of the creep life of ReneN5 is 89 hours, and the actual value of the creep life of CMSX-4 is 74 hours, respectively.

Subsequently, the results of a simulation carried out so as to make a comparison in a creep life between a Ni-based single crystal superalloy of the present embodiment and the first and second generation Ni-based single crystal superalloys with reference to FIG. 2 will be described.

The present simulation was carried out using "JMatPro V.5.0" developed by Sente Software Co. of Great Britain. The present software enables calculation of values of physical, thermodynamic and mechanical properties of a metal alloy by a chemical component thereof and it has already been proved that the creep life of the Ni-based single crystal superalloy corresponding to the technical field of the present invention can also be predicted with satisfactory accuracy as shown in FIG. 16 of the following literature (Literature: N. Saunders, Z. Guo, X. Li, A. P. Miodownik and J-Ph. Schille: MODELLING THE MATERIAL PROPERTIES AND BEHAVIOUR OF Ni-BASED SUPERALLOYS, Superalloys 2004, (TMS, 2004), pp.849-858.)

Figure 3:
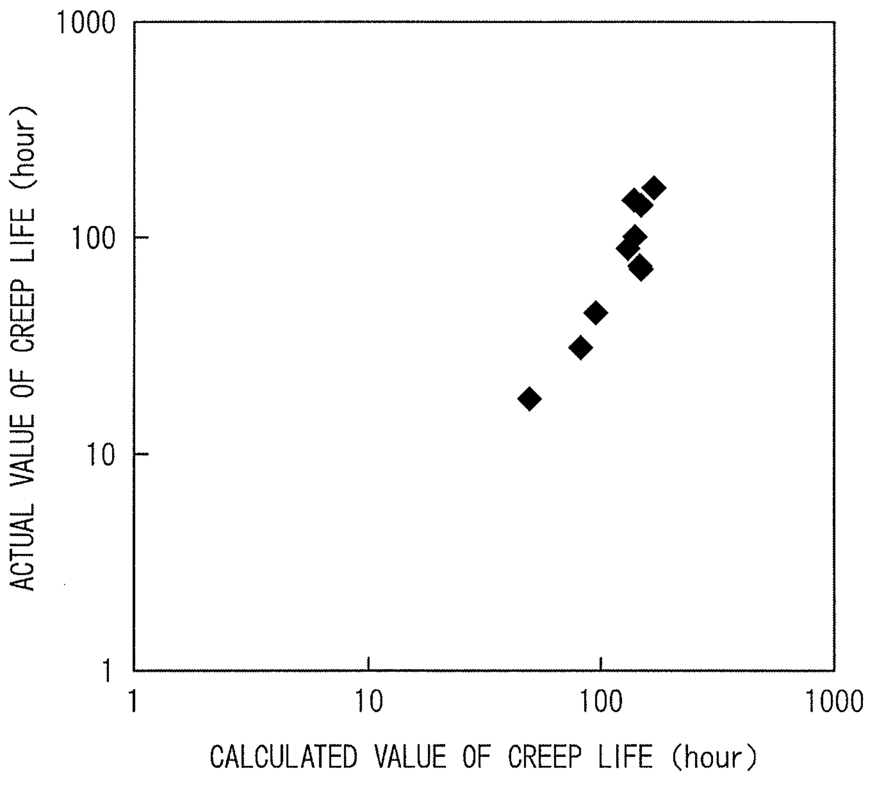
FIG. 3 is a graph showing validation results of a simulation.

The inventors of the present invention produced some single crystal superalloys and carried out a creep rupture test under the conditions at 1,100° C. under 137 MPa in the same manner as in the above test, and then made a comparison with the calculated value of the rupture life using "JMatPro V.5.0". FIG. 3 shows the comparison results. As shown in this figure, the calculated value of "JMatPro V.5.0" shows a satisfactory correlation (multiple correlation coefficient $R^2$=0.96) with the actual value obtained by the test, and it was confirmed that the results of the present simulation can be treated similarly with the actual value obtained by the test.

As shown in FIG. 3, the calculated value of "JMatPro V.5.0" agrees with the actual value obtained by the test particularly in the high creep life side (about 100 hours or more). In other words, "JMatPro V.5.0" enables calculation with satisfactory accuracy particularly in the high creep life side.

Figure 2:
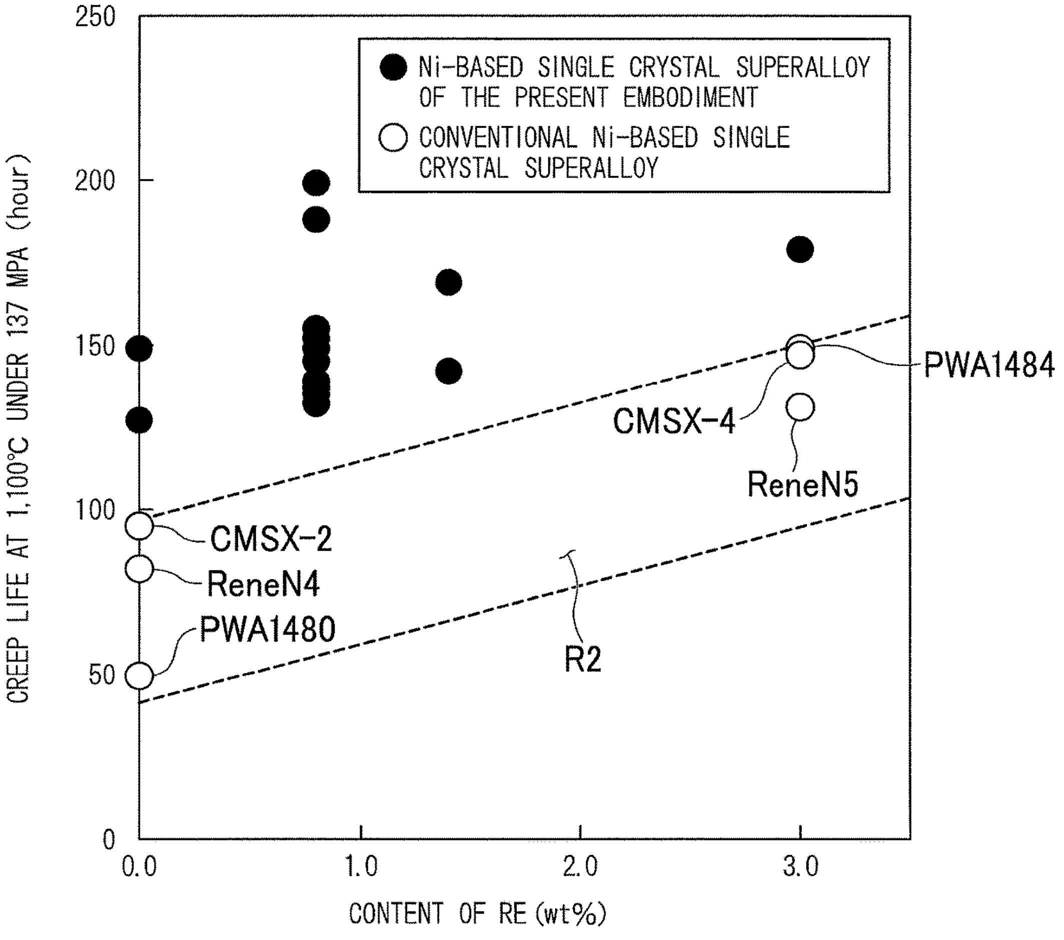
FIG. 2 is a graph obtained by a simulation for making a comparison in a creep life between a Ni-based single crystal superalloy according to one present embodiment of the present invention and the first and second generation Ni-based single crystal superalloys.

FIG. 2 is a graph for making a comparison in a creep life between a Ni-based single crystal superalloy according to one present embodiment of the present invention obtained by a simulation and the first and second generation Ni-based single crystal superalloys. In FIG. 2, the abscissa denotes the amount of Re (wt %), while the ordinate denotes the creep life.

Herein, black dots shown in FIG. 2 denote the results in which the creep life was measured by a simulation under the condition of a tensile load of 137 Mpa in the environment of a temperature of 1,100° C., using Ni-based single crystal superalloys a to r, each having the composition shown in FIG. 4. The Ni-based single crystal superalloys "a to c" have the same compositions as those of the Ni-based single crystal superalloy A to C used in the above test.

CMSX-2, CMSX-4, ReneN4, ReneN5, PWA1480 and PWA1484 4 shown by white dots in FIG. 2 denote the results of a simulation of Ni-based single crystal superalloys with the composition shown in FIG. 4 carried out under the same conditions as in the Ni-based single crystal superalloy of the present embodiment. CMSX-2, CMSX-4, ReneN4, ReneN5, PWA1480 and PWA1484 used in the present simulation have the same compositions as those of the conventional Ni-based single crystal superalloy used in the above test.

As is apparent from FIG. 4, the Ni-based single crystal superalloy of the present embodiment "a and q" clearly have longer creep life and higher creep strength as compared to CMSX-2, ReneN4 and PWA1480 which similarly do not contain Re as a useful component (first generation Ni-based single crystal superalloy).

From the creep life of CMSX-2, PWA1480, ReneN4, ReneN5, CMSX-4 and PWA1484, it is assumes that, when the amount of Re in these conventional Ni-based single crystal superalloys varies within a range of 3.0 wt % or less, the life of the Ni-based single crystal superalloy is included in the region R2 shown in FIG. 2. As is apparent from FIG. 4, the Ni-based single crystal superalloys "b, b2, and d to o" of the present embodiment clearly have longer creep life as compared to the creep life (region R2) to be assumed in the case where a conventional Ni-based single crystal superalloy contains 0.8 wt % of Re, and also has higher creep strength.

It is possible to confirm that the Ni-based single crystal superalloy "c and p" of the present embodiment clearly has longer creep life as compared to the creep life (region R2) to be assumed in the case where a conventional Ni-based single crystal superalloy contains 1.4 wt % of Re, and also has higher creep strength. As is apparent from FIG. 4, the Ni-based single crystal superalloys "b, b2 and d to o" of the present embodiment have longer creep life and higher creep strength as compared to the first generation Ni-based single crystal superalloy.

Furthermore, the Ni-based single crystal superalloy "r" of the present embodiments is that for comparison and contains 3.0 wt % of Re, which is equal to that in the conventional second generation Ni-based single crystal superalloy, and it is possible to confirm that the creep strength becomes higher as compared to the conventional Ni-based single crystal superalloy.

As is apparent from FIG. 2, the Ni-based single crystal superalloys "a to r" of the present embodiment have the creep strength which is comparable with or higher than that of the conventional Ni-based single crystal superalloy.

Specifically, it is possible to confirm that the Ni-based single crystal superalloy of the present embodiment has characteristics improved by 30% or more as compared to the conventional Ni-based single crystal superalloy having the same content of Re.

The amount of Re in the above-described Ni-based single crystal superalloy of the present embodiment (excluding comparative Ni-based single crystal superalloy "r" used in the simulation) is less than 3.0 wt %. Therefore, the Ni-based single crystal superalloy of the present embodiment has smaller amount of Re as compared to the second generation Ni-based single crystal superalloy.

The Ni-based single crystal superalloy of the present embodiment has higher creep strength as compared to the first generation Ni-based single crystal superalloy.

Therefore, the Ni-based single crystal superalloy of the present embodiment has smaller amount of Re as compared to the second generation Ni-based single crystal superalloy, and is also excellent in creep strength as compared to the first generation Ni-based single crystal superalloy.

In the conventional Ni-based single crystal superalloy, it is necessary to add Ru, as rare metal, so as to inhibit the generation of a deteriorated layer due to the addition of Re. However, in the Ni-based single crystal superalloy of the present embodiment, it is not necessary to contain Ru and thus it becomes possible to perform cost reduction.

Subsequently, the results of a test carried out so as to make a comparison in a fatigue strength and a creep life between Ni-based single crystal superalloys of the present embodiment (Ni-based single crystal superalloys A and B2 (described above)) and the first and second generation Ni-based single crystal superalloys with reference to FIG. 5 and FIG. 6 will be described.

Figure 5:
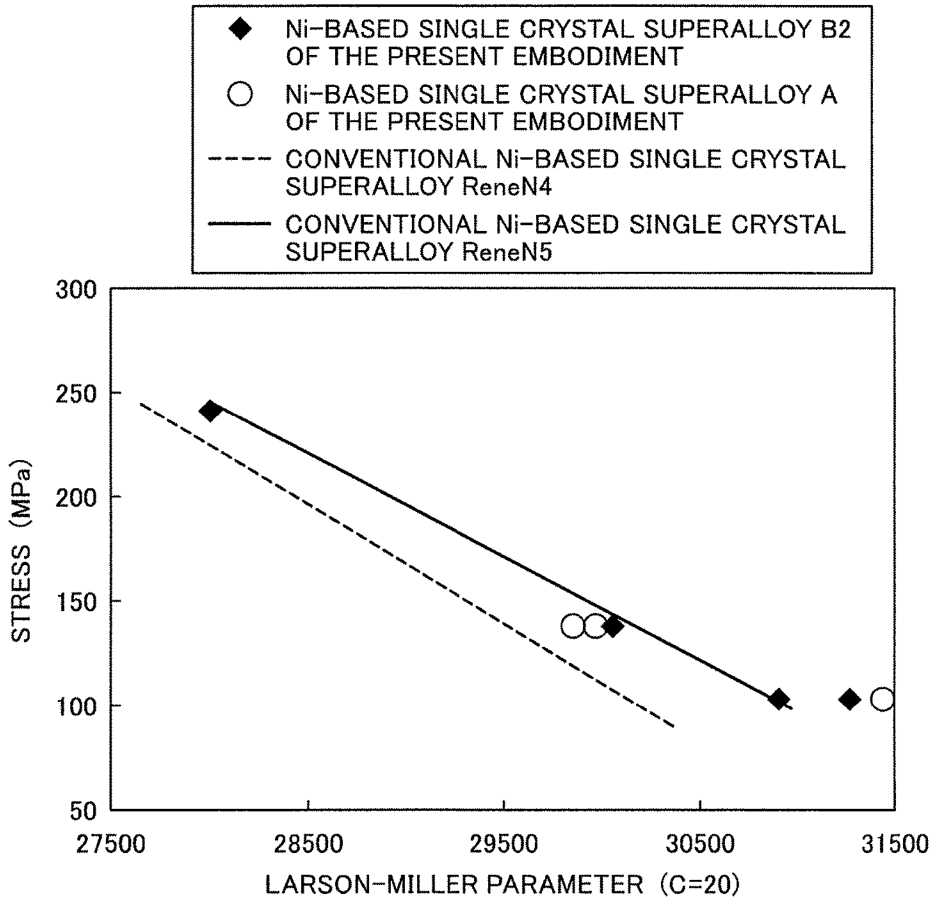
FIG. 5 is a graph obtained by a test for making a comparison in a creep life between a Ni-based single crystal superalloy according to the present embodiment and the first and second generation Ni-based single crystal superalloys.

FIG. 5 is a graph for making a comparison in a creep life between Ni-based single crystal superalloys A and B according to the present embodiment obtained by a test and the first and second generation Ni-based single crystal superalloys. The abscissa denotes the Larson-Miller parameter, while the ordinate denotes the load (stress generated in the alloy). The Larson-Miller parameter is a numerical value showing a relation between the load and the rapture time, and is represented by the equation: $P=T(\text{Log TIME}+C)\times 10^3$ (wherein, T is an absolute temperature, TIME is a creep rupture life, and C is a material constant (C=20) in this case).

As is apparent from FIG. 5, the Ni-based single crystal superalloys A and B2 of the present embodiment clearly have longer creep life as compared to ReneN4 which similarly contains Re as a useful component, and also the creep life which is comparable with that of ReneN5 containing 3.0 wt % of Re.

Figure 6:
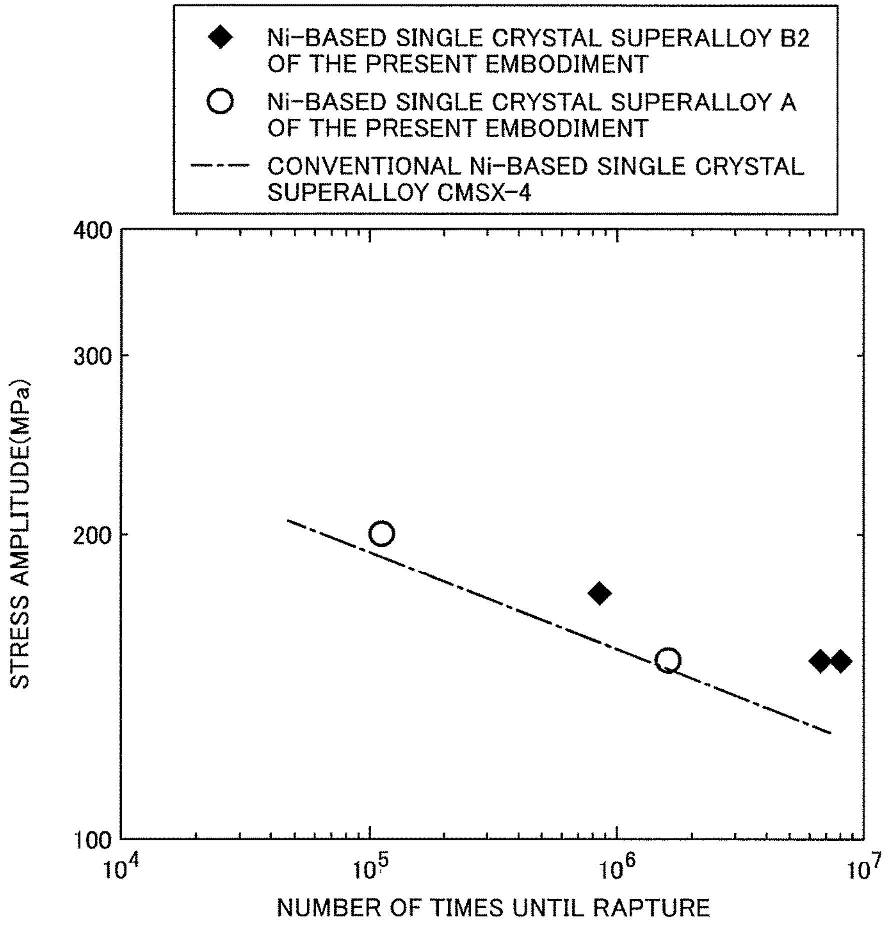
FIG. 6 is a graph obtained by a test for making a comparison in a creep life between a Ni-based single crystal superalloy according to the present embodiment and the second generation Ni-based single crystal superalloy.

FIG. 6 is a graph for making a comparison in high-temperature fatigue strength between Ni-based single crystal superalloys A and B2 according to the present embodiment obtained by a test and the second generation Ni-based single crystal superalloy. The abscissa denotes a number of times until the rapture (logarithm), while the ordinate denotes the stress amplitude. In the fatigue test, the temperature condition is 1,093° C. and the stress ratio R=0 (A=1).

As is apparent from FIG. 6, the Ni-based single crystal superalloy A of the present embodiment shows a fatigue life, which corresponds with that of ReneN5 containing 3.0 wt % of Re, in high-temperature environments. The Ni-based single crystal superalloy B2 of the present embodiment, which contains 0.8 wt % of Re, shows excellent fatigue life in high-temperature environments as compared to ReneN5 containing 3.0 wt % of Re.

Figure 7:
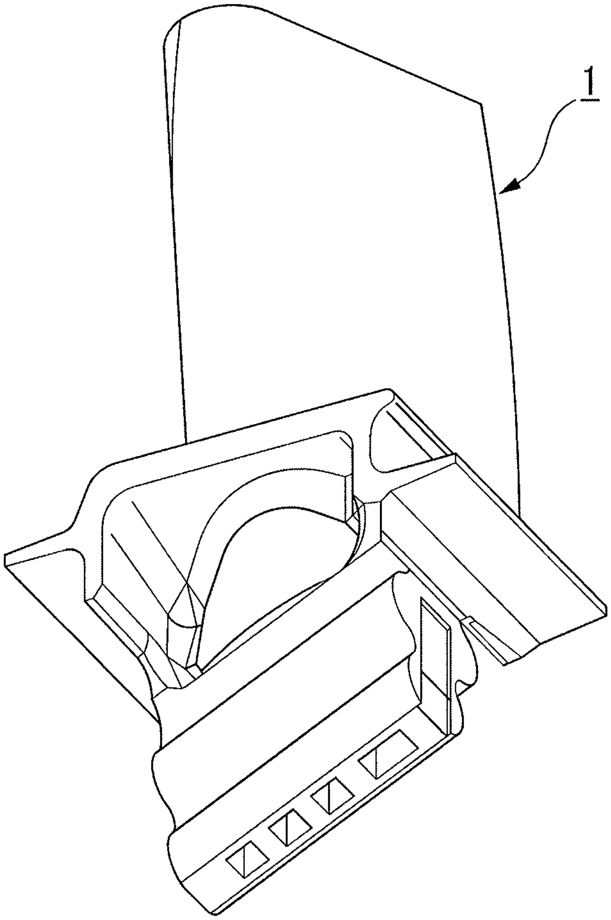
FIG. 7 is a perspective view of a turbine blade which incorporates the Ni-based single crystal superalloy of one present embodiment of the present invention.

The Ni-based single crystal superalloy of the present embodiment can be used as the material that forms a turbine blade 1 shown in FIG. 7.

The turbine blade 1 which incorporates the Ni-based single crystal superalloy of the present embodiment has small amount of Re and is also excellent in high-temperature strength, mainly creep strength. Therefore, a turbine blade 1, which is inexpensive and has high strength, can be obtained.

While the invention has been described by way of forgoing Examples, but is not limited to the Examples. Also various combinations and selections of various disclosed essential elements are for illustrative purpose only and can be made without departing from the scope of the present invention.

INDUSTRIAL APPLICABILITY

According to the present invention, it is possible to obtain a Ni-based single crystal superalloy which has a smaller amount of Re as compared to a conventional Ni-based single crystal superalloy, and is also excellent in high-temperature strength, mainly creep strength.

DESCRIPTION OF THE REFERENCE SYMBOLS

1: Turbine blade
A-C, a-r: Ni-based single crystal superalloys

The invention claimed is:

1. A method of manufacturing a Ni-based single crystal superalloy which has the following composition by weight: 8.0 wt % of Co, 7.0 wt % of Cr, 1.8 wt % of Mo, 8.2 wt % of W, 6.0 wt % of Ta, 5.2 wt % of Al, 1.6 wt % of Ti, 0.10 wt % of Hf, and 0.8 wt % of Re with the remainder including Ni and unavoidable impurities, and wherein said superalloy contains no Nb or contains it as an unavoidable impurity, wherein the Ni-based single crystal superalloy is obtained by performing a solution heat treatment and an aging treatment to an alloy ingot which has the above-described composition, and wherein the solution heat treatment is carried out by raising the ingot from a temperature within a range of 1,503 to 1,563 K (1,230 to 1,290° C.) to a temperature within a range of 1,573 to 1,613 K (1,300 to 1340° C.) by a multi-stage step, followed by maintaining of such a temperature for 1 hour or more; and the aging treatment is carried out by performing a primary aging treatment of maintaining the ingot at a temperature within a range of 1,273 to 1,423 K (1,000° C. to 1,150° C.) for 3 to 5 hours and by performing a secondary aging treatment of maintaining the ingot at a temperature within a range of 1,073 to 1,223 K (800° C. to 950° C.) for 15 to 25 hours.

* * * * *